(12) United States Patent
Ashida (10) Patent No.: US 6,780,659 B2
(45) Date of Patent: Aug. 24, 2004

(54) STENCIL MASK AND METHOD OF PRODUCING THE SAME, SEMICONDUCTOR DEVICE PRODUCED USING THE STENCIL MASK AND METHOD OF PRODUCING THE SEMICONDUCTOR DEVICE

(75) Inventor: Isao Ashida, Kanagawa (JP)

(73) Assignee: Sony Corporation (JP)

( * ) Notice: Subject to any disclaimer, the term of this patent is extended or adjusted under 35 U.S.C. 154(b) by 239 days.

(21) Appl. No.: 10/184,903

(22) Filed: Jul. 1, 2002

(65) Prior Publication Data

US 2003/0022496 A1 Jan. 30, 2003

(30) Foreign Application Priority Data

Jul. 4, 2001 (JP) .................................... P2001-203533

(51) Int. Cl.⁷ .......................... H01L 21/66; G01R 31/26
(52) U.S. Cl. ...................................................... 438/16
(58) Field of Search ........................... 438/16, 14–15, 438/7, 690, 798, 514; 250/492.23; 430/5

(56) References Cited

U.S. PATENT DOCUMENTS

| 5,376,802 A | * | 12/1994 | Sakamoto et al. | ..... 250/492.23 |
| 5,912,469 A | * | 6/1999 | Okino | ..... 250/492.23 |
| 2001/0013581 A1 | * | 8/2001 | Takemoto et al. | ..... 250/492.22 |

FOREIGN PATENT DOCUMENTS

| JP | 9-218032 | 8/1997 |
| JP | 9-326349 | 12/1997 |

* cited by examiner

Primary Examiner—Craig A. Thompson
(74) Attorney, Agent, or Firm—Rader, Fishman & Grauer PLLC; Ronald P. Kananen (57) ABSTRACT

A stencil mask is disclosed which can be produced by performing pattern correction in a practically applicable comparatively short period of time. When stencil mask pattern data are corrected by a stress analysis, displacement amounts are calculated for those of stencil hole patterns which have a size equal to or greater than a predetermined size. As a result, stencil mask pattern data having corrected patterns are obtained in a comparatively short period of time which can be applied industrially. By producing a stencil mask based on the patterns, a stencil mask in which a desired pattern is formed is obtained.

8 Claims, 6 Drawing Sheets

STENCIL MASK AND METHOD OF PRODUCING THE SAME, SEMICONDUCTOR DEVICE PRODUCED USING THE STENCIL MASK AND METHOD OF PRODUCING THE SEMICONDUCTOR DEVICE

BACKGROUND OF THE INVENTION

This invention relates to a stencil mask wherein the shape of a stencil hole is corrected, a method of producing the stencil mask, a semiconductor device produced using the stencil mask and a method of producing the semiconductor device.

Semiconductor devices continue to be refined more and more such that the patterning thereof with light is getting more and more difficult. Thus, lithography techniques based on an X-ray, an electron beam, an ion beam and so forth have been proposed, investigated and developed.

One of the novel techniques uses a stencil-like mask formed from a plate which does not allow a used beam to transmit therethrough and having a hole of a desired pattern shape formed therein for allowing the beam to pass through, which is different from a mask structure conventionally used in light lithography and formed from a hard plate which allows a used beam to transmit therethrough and having a pattern provided thereon by a substance which intercepts, absorbs or scatters the beam.

The stencil mask is in most cases formed as a thin film in order that the pattern accuracy may not be deteriorated by a beam reflected by a side wall of a hole in the stencil mask when the beam passes through the hole.

In a process of the formation of a stencil mask, a thin film before a pattern is formed, that is, before a stencil-like hole is perforated, is in an equilibrium state in a condition wherein the initial stress which appeared upon crystal growth and the internal stress, such as stress caused by a mask structure, remains; and, when a stencil-like hole is formed, the internal stress at the pattern portion of the hole is released. Consequently, the pattern itself is distorted and distorts some other pattern. Particularly, in the case of a stencil mask of a thin film, depending upon the material, the distortion is so great that it cannot be ignored.

Further, generally in the case of a stencil mask, since the shape of the mask material itself is a pattern to be transferred, there is a restriction that a pattern having a shape which itself cannot be kept from a condition of a pattern shape, a material, a thickness or the like, such as a doughnut-shaped pattern or a long cantilever structure, cannot be formed. Therefore, a system called complementary mask is used. According to the complementary mask system, transfer from a mask to a wafer is not performed by irradiation with a single mask, but by successive irradiation with a plurality of masks produced in advance and representative of different divisional parts of an object pattern to transfer the object pattern to a wafer. Since the distortion called in question here appears in a different fashion depending upon the pattern shape, linkage of the pattern may not be performed accurately between different irradiation cycles.

Similarly, because the distortion depends upon the pattern, degradation of the overlapping accuracy between different mask layers of the pattern occurs.

Various contrivances for a process of production of a mask and contrivances for a mask structure for reducing the internal stress which causes the distortion or the degree of influence of the stress upon the distortion have been proposed. Separately from the contrivances, a method of predicting distortion caused by internal stress by a stress analysis or the like and producing a mask with a pattern corrected in advance using a result of the prediction is disclosed in Japanese Patent Laid-Open No. Hei 9-326349 or No. Hei 9-218032. The method disclosed therein relates to lithography wherein an X-ray is used as a light source and is directed not to a stencil mask but to the elimination of distortion by a pattern of a material which absorbs an X-ray because a substrate material which transmits an X-ray therethrough is thin. The method is characterized in that, in order to save the processing time for a stress analysis in the process of elimination of distortion, the shape of the absorber for realizing the pattern to be transferred is not directly stress-analyzed but the area density of the absorber is used as a film thickness upon the stress analysis.

From the point of view of elimination of the distortion, it is considered that, in principle the techniques described above can also be applied to a stencil mask. However, in order for the area density to represent a pattern to be handled, the following prerequisites are required: each pattern to be handled must be small, a variation in shape thereof can be ignored, and the distortion must appear only at the position of the pattern and not in the shape itself. Among patterns of an actual LSI, a very great pattern when compared with the size of contacts which form scribe lines and so forth is present at an outer peripheral portion of a chip even with a mask for a contact layer, which only includes patterns of almost the same shape within a chip area. If the patterns including such very great patterns are handled with the area density, then the distortion calculation in each of the areas which include the very great patterns involves great errors.

Thus, it is demanded that stress correction of a stencil mask be performed by calculation with a high accuracy and at a high speed to correct patterns, even if a large-scale pattern is involved.

Internal stress acting in a stencil mask is known if the history of the material and the process of production of the stencil mask are known. The distortion can be readily calculated in accordance with a technique of the strength of materials which uses stress information and information of pattern shapes and properties of the mask material. Since the stencil mask is in the form of a flat plate, the plane stress analysis can be applied satisfactorily as the analysis means, and usually the finite-element method is used as the particular calculation method.

In order to perform the plain stress analysis in accordance with the finite-element method, the shape of the object of the analysis is divided into simple elements. If the object of the analysis is, for example, a stencil mask 11 shown in FIG. 3A, which is shaped so as to have a single large stencil hole 12 and four small stencil holes 13, then the surface of the stencil mask 11, except for the stencil holes 12 and 13, is divided into an aggregate of simple triangular elements, as seen in FIG. 3B.

Although the elements may have various forms such as quadrangles or complicated elements having nodes for analysis on the sides thereof, a triangle is the simplest form and is utilized frequently.

Figure 4:
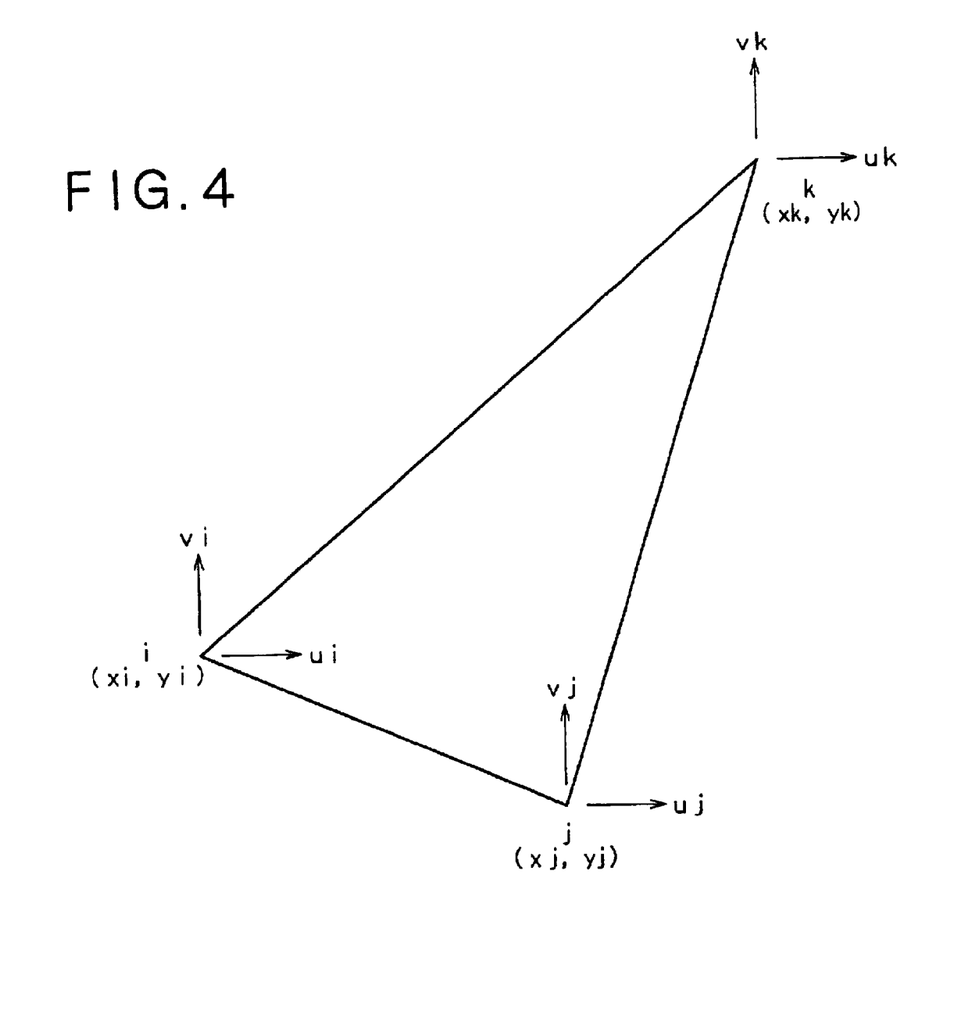
FIG. 4 is a view illustrating variables to be used for calculation of the nodes of a triangle in the case of division into triangles.

In the case of a triangle element, it is determined that the displacement amounts at the nodes of each element, that is, at the vertices i, j, k of a triangle, in the direction of the X-axis caused by stress are represented by $U_i, u_j, U_k$ and the displacement amounts in the direction of the Y-axis are represented by $v_i$, $v_j$, $V_k$, as seen in FIG. 4. These displacement amounts can be determined by a stress analysis.

In the related art described above, the original pattern is corrected so that a desired pattern shape may be reached as a result of the displacement of the nodes. Strictly, therefore, mathematical processing is applied to determine an inverse function or the like to determine the amounts to be corrected. This, however, requires complicated processing and involves a more exact calculation than is necessary.

Figure 5:
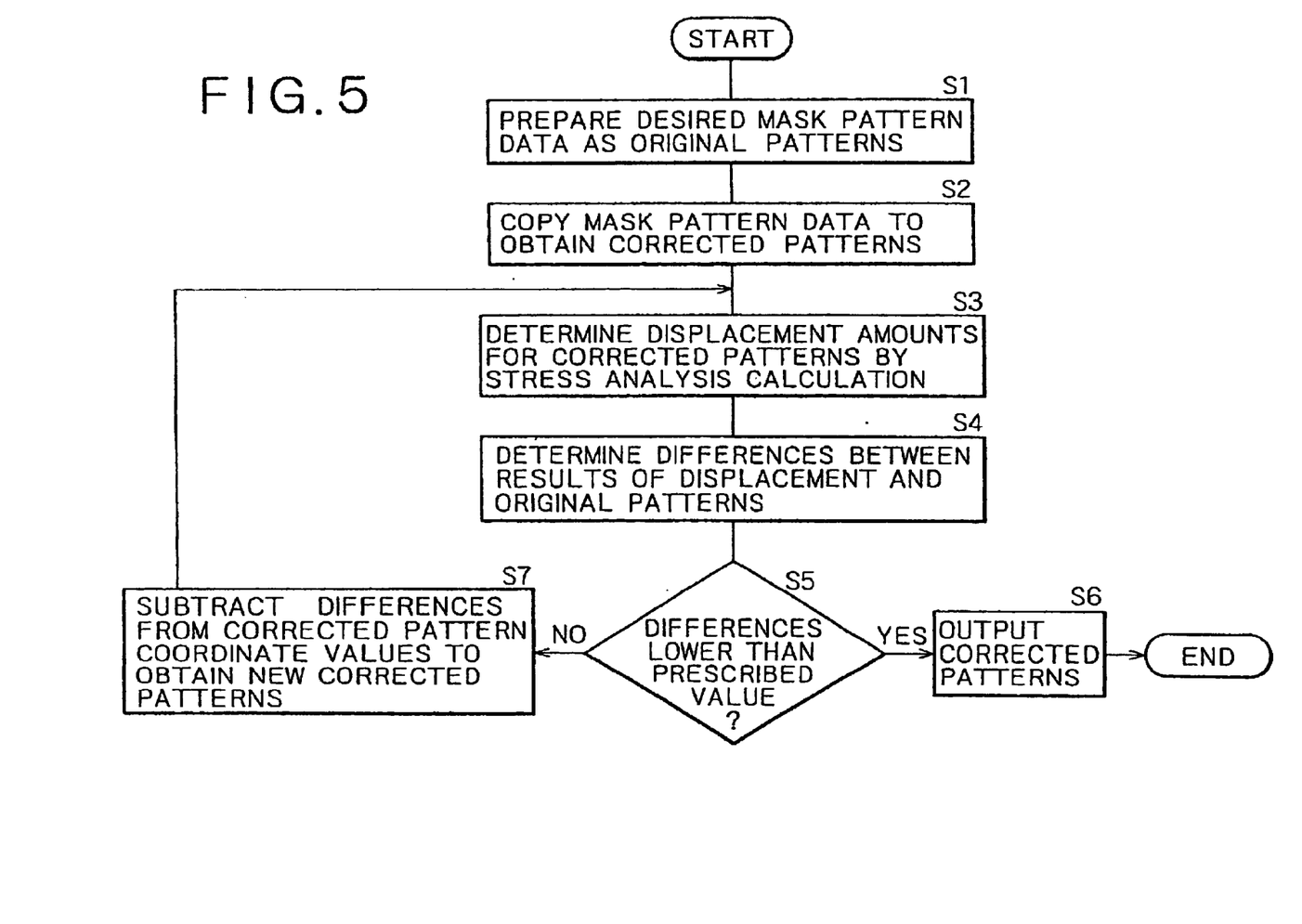
FIG. 5 is a flow chart illustrating a process for displacement amount correction in which a stress analysis method is used.

In order to eliminate such a drawback, a process illustrated in the flow chart of FIG. 5 is performed. Referring to FIG. 5, in the process illustrated, desired mask pattern data are prepared as an original pattern first at step S1, and are then copied to produce a first corrected pattern at step S2. A stress analysis is then performed for the first corrected pattern at step S3, and displacement amounts obtained by the stress analysis are regarded as correction amounts of negative values and subtracted from coordinate values of the nodes of the original pattern. A result of the subtraction is regarded as a second corrected pattern and a stress analysis of the second corrected pattern is performed. Differences between the results of the displacement obtained by the stress analysis and the original pattern are calculated at step S4. If the differences are within an allowable range (YES at step S5), then the pertaining second corrected pattern is outputted at step S6, thereby ending the process. However, if the differences are outside the allowable range (NO at step S5), then they are subtracted from the coordinate values of the nodes of the second corrected pattern to obtain a third corrected pattern at step S7, and the processing returns to step S3 so that stress calculation is performed once again at step S3 and the differences are calculated at step S4. Then, it is checked whether or not the differences are within the allowable range at step S5. By repeating the operation until the difference values fall within the allowable range, a stencil mask having a desired pattern having little distortion can be provided.

Figure 6A:
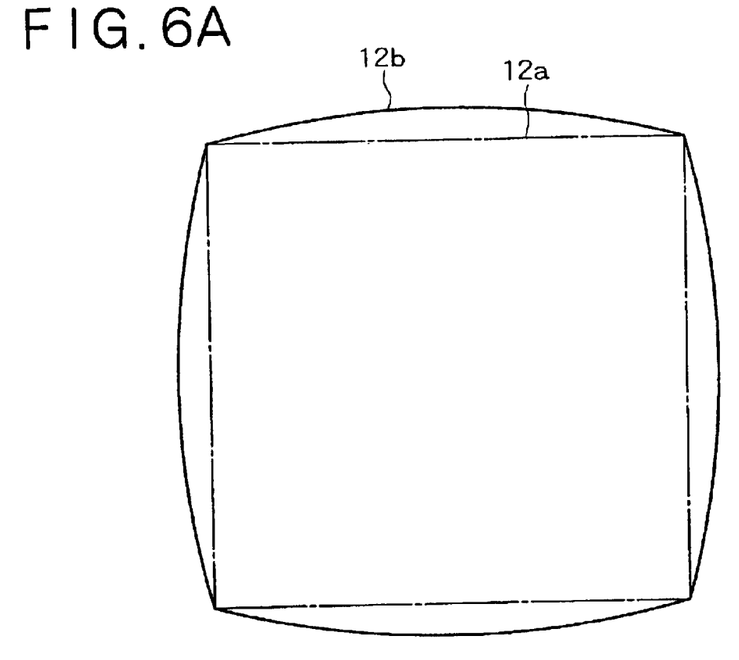
FIG. 6A is a view showing a stencil hole (solid line) formed actually when a stencil hole (alternate long and short dash line) is perforated with stencil mask pattern data.
Figure 6B:
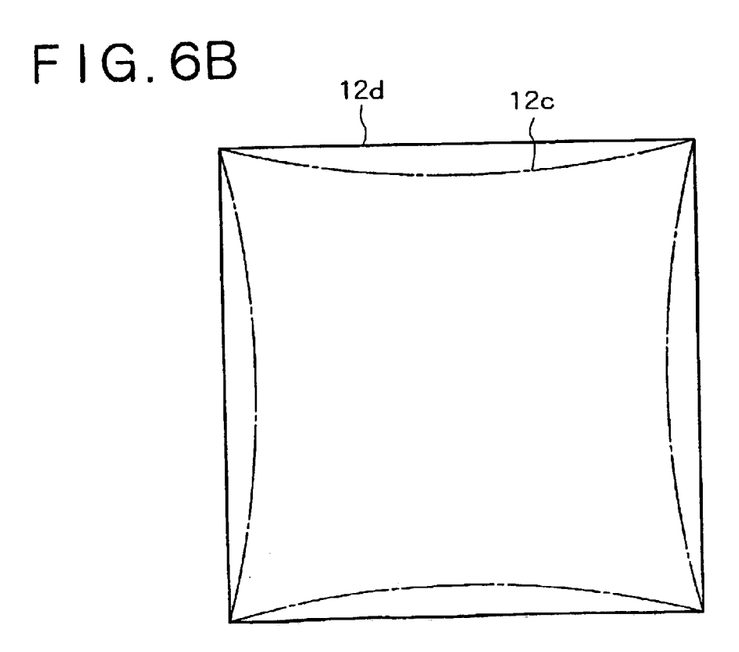
FIG. 6B is a view showing a stencil hole (solid line) formed actually when a stencil hole (alternate long and short dash line) curved to the inner side taking a result of FIG. 6A into consideration is perforated.

In particular, if a stencil hole 12a (indicated by an alternate long and short dash line) having the same shape as a desired pattern is perforated on an actual stencil mask as shown in FIG. 6A. The internal stress (in the example shown, tensile stress) is then released in the interface of the stencil hole, and an actual stencil hole 12b is displaced and becomes a hole having such a curved contour, as indicated by a solid line. If a stencil hole 12c (alternate long and short dash line) curved to the inner side in advance, as shown in FIG. 6B, is perforated taking the displacement amount into consideration, then the internal stress is released in the interface of the stencil hole, and due to the displacement, an actual stencil hole 12d becomes such a hole having linear sides of a desired pattern as indicated by solid lines.

As described above, according to the finite-element method used popularly in the process of stress analysis, a complicated shape is divided into simple elements for analysis. The number of elements becomes very large as a result of the division, and, for example, in the example of the shape of FIGS. 3A and 3B, which only have five holes as patterns on a stencil mask, the shape is represented by more than 200 elements.

In the finite-element method, since the displacement amounts in the X-axis direction and the Y-axis direction are calculated for each vertex, operation of solving simultaneous linear equations having a number of equations equal to twice the total number of nodes is required. In the example of FIG. 3B, the number of nodes is approximately 150, and simultaneous linear equations with 300 unknowns are solved for a stress analysis of the stencil mask having five holes.

A pattern of an actual LSI involves a very great number of graphic forms, and, for example, a contact layer of the 0.18 μm generation includes approximately 100,000,000 graphic forms per one chip. If a stencil mask having a pattern including such a great number of graphic forms as just mentioned is divided into elements, then a further great number of elements is obtained.

Simultaneous linear equations obtained from information of the elements obtained by such division in the stage of analysis and so forth are represented by a matrix. Although various efficient solving methods are available, even if such solving methods are applied, an unrealistically long calculation time is required for the very great number of elements.

SUMMARY OF THE INVENTION

It is an object of the present invention to provide a stencil mask that can be produced by performing a pattern correction of the stencil mask by a stress analysis in a practically applicable comparatively short period of time, a method of producing the stencil mask, a semiconductor device produced using the stencil mask, and a method of producing the semiconductor device.

According to the present invention, there is provided a method of producing a stencil mask, including the steps of calculating the displacement amounts of a stencil hole shape arising from an opening of the stencil hole in a stencil mask for each of the stencil hole patterns using a plane stress analysis, correcting the hole pattern based on the results of the calculation to obtain a desired pattern shape, and forming a desired pattern shape in the stencil mask based on the pattern shape, the calculating step calculating the displacement amounts only of those stencil hole patterns which have a size equal to or greater than a predetermined size. According to the present invention, a stencil mask produced by the production method, a semiconductor device produced using the stencil mask and a method of producing the semiconductor device are also provided.

In the following, the present invention is described in detail.

In the present invention, it is intended to form a desired pattern on an actual stencil mask by correcting the stencil mask pattern data for formation of the desired pattern on an actual stencil mask in accordance with a pattern to be formed.

This is because, if stencil mask pattern data for formation of the same pattern as the desired pattern are used and a pattern is formed on an actual stencil mask based on the pattern data, then an accurate pattern is not formed on the stencil mask because distortion occurs with the stencil mask due to internal stress or the like of the stencil mask, as described above.

As described hereinabove, when a plane stress analysis by the finite-element method or the like is performed to correct stencil mask pattern data, if the stress analysis is performed for all of the stencil hole patterns involved, then a long period of time, which cannot be applied practically, is required. Thus, although accurate pattern correction is possible, the plane stress analysis by the finite-element method cannot be applied industrially.

The present invention has been made by the inventor of the present application through an investigation to reduce the period of time required for the plane stress analysis to make it possible to industrially use the plane stress analysis for pattern correction of a stencil mask.

In the production of a stencil mask for a semiconductor device of an actual LSI, a material which does not exhibit much distortion by stress is selected as a material for the stencil mask, and the thickness of the mask is reduced as much as possible. However, the thickness of the mask is greater to some degree than that of the size of many graphic forms of a semiconductor device on the LSI. Accordingly, the variation in shape of a stencil hole on the stencil mask which corresponds to a small graphic form on the LSI is so small that it can be ignored. In other words, a stencil hole having a size smaller than a predetermined size exhibits a displacement amount in shape within an allowable range, and even if a charged particle beam is irradiated upon the semiconductor device without performing correction for the stencil hole, a pattern having substantially the same shape as that of the desired pattern is formed on the semiconductor device. Accordingly, even if the stress analysis for stencil hole pattern data shapes having a size smaller than the predetermined size is omitted, this has little influence on the accuracy of the shapes of the stencil holes.

The "predetermined size" in the present invention depends upon a relationship between an accuracy in dimension allowed for a stencil mask setting for each of the generations of object semiconductor devices and a degree of variation of a pattern by stress which depends upon the material and the thickness of the stencil mask.

Here, the accuracy in dimension allowed for a mask is calculated based on an allowable displacement range allowed for a pattern of an object semiconductor device and set in accordance with an application of the semiconductor device and so forth. Meanwhile, the degree of variation of a pattern by stress can be calculated theoretically or determined through an experiment.

In this manner, in the present invention, a stencil hole having a size smaller than a predetermined size is treated such that it exhibits substantially no distortion in shape. However, a positional displacement of the stencil hole cannot be ignored because it exhibits an accumulated value of distortion by stencil holes around the stencil hole. Therefore, the displacement amount regarding the position of each small graphic form is calculated, based on a displacement amount of a node around the small graphic form calculated by the preceding stress calculation, by simple linear interpolation with the distance from the node to the small graphic form taken into consideration.

The displacement by a small graphic form is very small, and the influence of the displacement matters with a result of accumulation of such displacements in a global region of the chip level of the LSI. Thus, there is little significance in carrying out the interpolation method itself strictly, but simple linear interpolation can be used as a necessary and satisfactory interpolation.

Further, in the present invention, while it is intended to reduce the analysis time by removing a large number of small graphic forms from among the object shapes of a stress analysis, an accumulated displacement amount arising from a large number of small graphic forms is not taken into consideration.

In the present invention, the disadvantage just described is eliminated or moderated by taking notice of the following basic relational expression used in a popular finite-element method:

$$\{p\}=At[B]^T[D][B]\{d\}$$

where $\{p\}$ is a vector of an external force applied to a node, A is the area of an element, t is the thickness of the element, $[B]$ is a displacement-distortion matrix of the element, $[B]^T$ is a transposed matrix of $[B]$, $[D]$ is a stress-distortion matrix of the element, and $\{d\}$ is a displacement amount vector of the node.

From the expression above, it can be recognized that At (area×thickness), which is the volume of the element, has an influence on the entire expression simply in the form of product. From this, the distortion of each element by small graphic forms can be calculated further accurately by causing the variation in volume by stencil holes having a size smaller than the predetermined size and removed from within the element to reflect on At. Also, it is possible to recognize the operation that the analysis is performed assuming that the element at the removed stencil hole portions imaginarily has a reduced thickness.

Although the reflection of removed small graphic forms upon the volume of an analysis element is not an essential requirement, if it is performed together with the displacement amount only of stencil holes having a size greater than the predetermined size, which is the essential requirement of the present invention, pattern correction of a stencil mask can be performed with a higher degree of accuracy or almost without degradation of the accuracy when compared with that in an alternative case wherein calculation of the displacement is performed for all stencil holes.

A semiconductor device having a desired pattern can be produced by irradiating a charged particle beam upon the stencil mask of the present invention so that the charged particle beam passing through the stencil mask may be irradiated upon the surface of a semiconductor device to form a pattern shape corresponding to a desired pattern of the stencil mask on the surface of the semiconductor device.

BRIEF DESCRIPTION OF THE DRAWINGS

These and other objects of the invention will be seen by reference to the following description, taken in connection with the accompanying drawing, in which.

DESCRIPTION OF THE PREFERRED EMBODIMENT

In the following, a method of producing a stencil mask to which the present invention is applied is described with reference to FIGS. 1, 2A and 2B.

Figure 1:
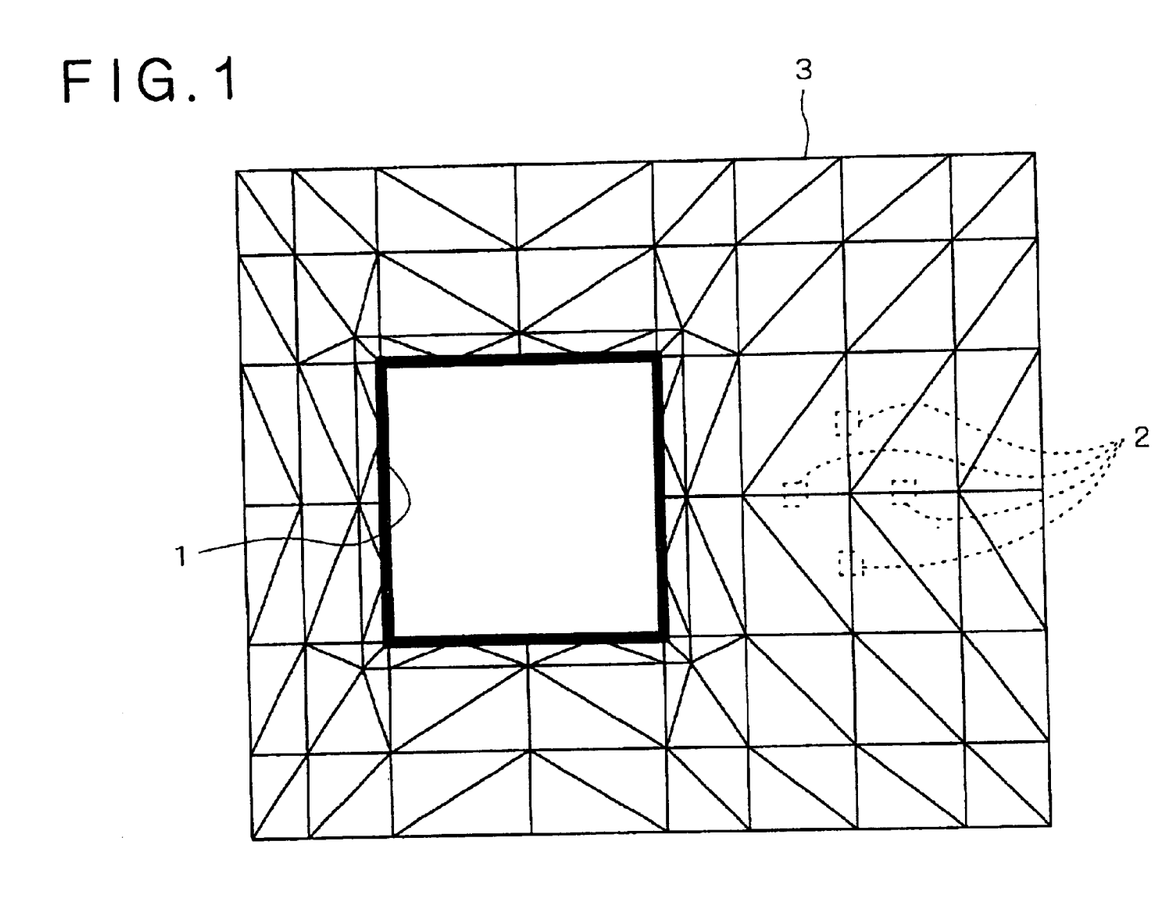
FIG. 1 is a plan view illustrating an example of the division of a stencil mask pattern to be used for production of a stencil mask according to the present invention into a large number of triangular elements for analysis by the finite-element method.
Figure 2A:
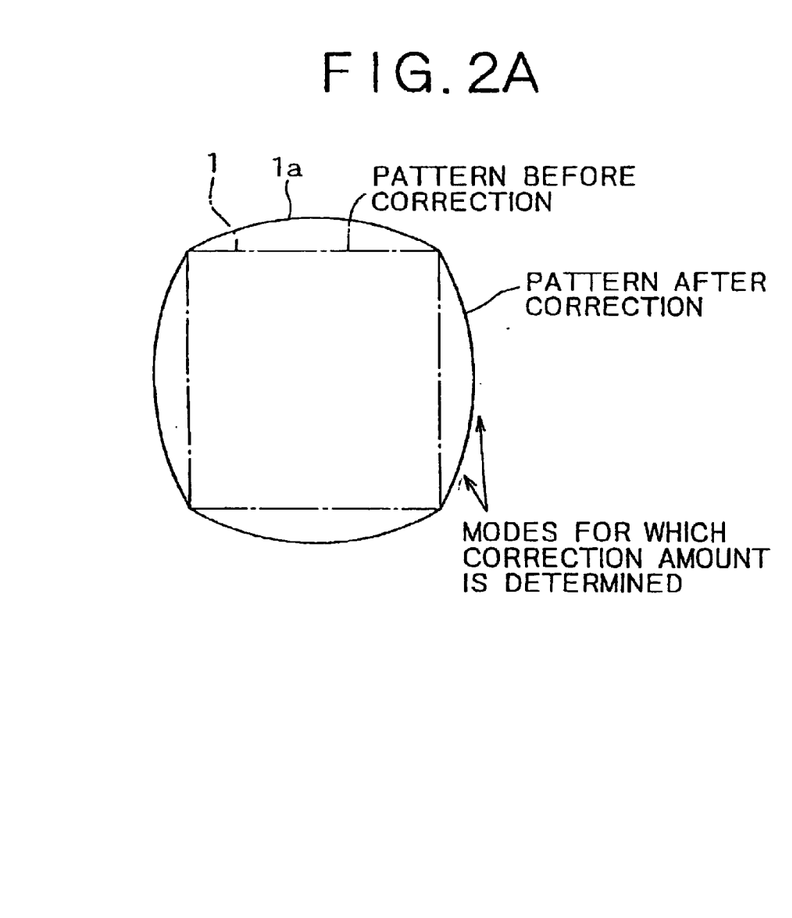
FIG. 2A is a schematic view illustrating a stencil hole pattern having a curved contour after correction by a stress analysis is performed.
Figure 2B:
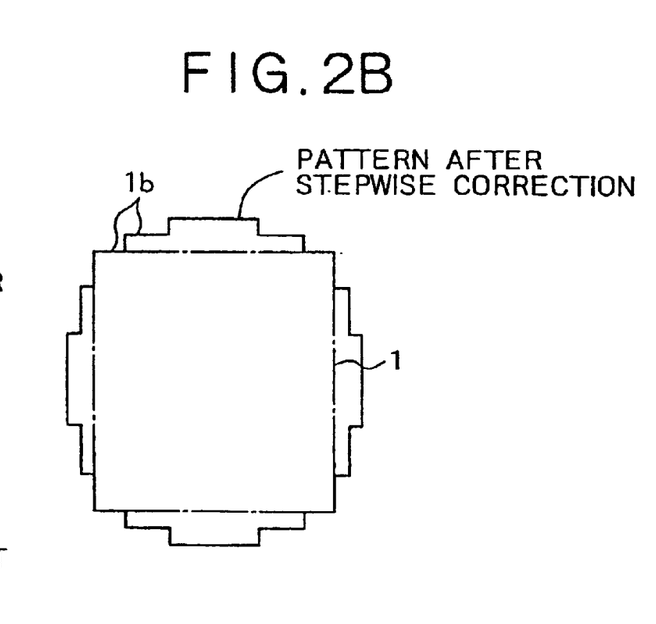
FIG. 2B is a schematic view of the stencil hole pattern of FIG. 2A after stepwise correction is performed.

Referring first to FIG. 1, a rectangular stencil mask pattern 3 having a single large stencil hole pattern 1 and four small stencil hole patterns 2 is shown. The stencil mask pattern 3 is divided into triangular elements except the large stencil hole pattern 1; and, only the single large stencil hole pattern 1 is assumed present, while the presence of the four small stencil hole patterns 2 is ignored.

In the stencil mask pattern 3 shown, for example, the large stencil hole pattern 1 has a shape of a square having sides of 10 μm, and the small stencil hole patterns 2 have a shape of a square having sides of 100 nm. The numbers and the arrangement of the stencil hole patterns 1 and 2 are substantially the same as those of the stencil mask 11 of FIG. 3B.

Since, according to the stress analysis by the finite-element method, only a simple analysis is performed for each element, a stencil mask pattern is divided into comparatively small elements at a portion at which it is estimated that the stress variation is great (at which the stress is likely to be concentrated) or a portion for which it is preferable to perform a concise analysis, particularly in FIG. 1, a portion around the large stencil hole pattern 1. The number of elements obtained by the division in FIG. 1 is approximately 120.

On the other hand, in the stress analysis of the stencil mask 11 by the conventional finite-element method illustrated in FIG. 3B, fine division into elements is performed for all of the large stencil hole 12 and the small stencil holes 13, particularly the portions around them, and further fine division into elements is performed for portions around the small stencil holes 13. The number of elements obtained by the division in FIG. 3B is approximately 200.

A comparison between the divisions into elements for the finite-element method of FIGS. 1 and 3B reveals that the number of elements in FIG. 1 exhibits a decrease of approximately 80 by the omission of the stress analysis for the four small stencil hole patterns 2.

Although the example of FIG. 1 does not exhibit a decrease of a great number of patterns because it does not include a very great number of patterns, as the number of such patterns increases, the effect of the decrease exhibits a progressive increase.

The values of the correction amount obtained by such a process as described above are values representative of degrees by which the individual nodes should be corrected independently of each other. If the values are used as they are to perform correction, then the large stencil hole pattern becomes such a curved line 1a having a barrel-shaped contour as shown in FIG. 2A. If a great number of such graphic forms including an oblique line as described above are produced, then this increases the burden on the mask data process and/or the mask production process. The burden on the mask data process invites a waste of processing time, and the burden on the mask production process invites a drop in the accuracy of the mask produced.

Therefore, an accuracy allowed for the correction process is determined from an accuracy allowed for the production of a mask, and an allowable pitch for correction is determined with reference to the thus determined accuracy value. Then, a portion to be represented as an oblique line is corrected into a stepwise contour line, as shown in FIG. 2B, with the thus determined allowable pitch, so that it may include only vertical and horizontal straight lines 1b eliminating the oblique line. Thus, not only in the data process but also in the mask production, an excessive burden by oblique lines is eliminated.

Now, simulations regarding the correction of a stencil mask pattern according to the present invention and the related art are performed to calculate a shortened period of time.

Figure 3A:
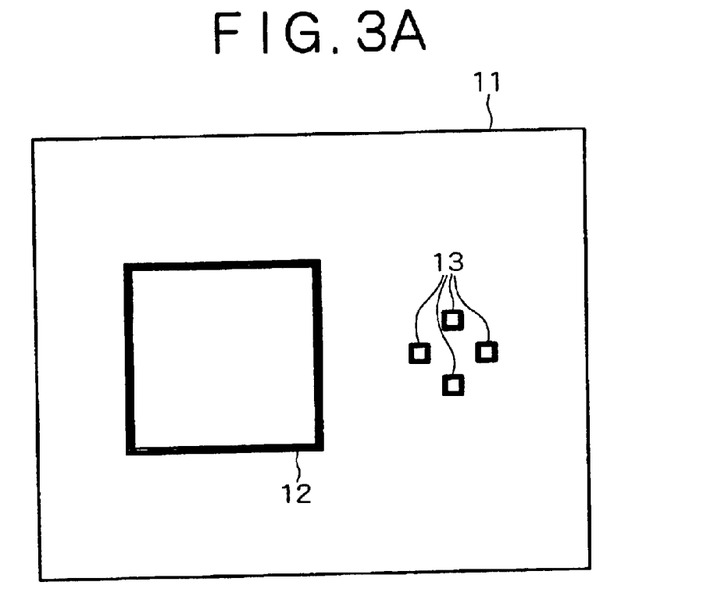
FIG. 3A is a plan view illustrating a stencil mask having a large stencil hole and small stencil holes and FIG. 3B is a plan view illustrating an example of the division of the stencil mask of FIG. 3A into elements using a conventional method in order to analyze the stencil mask in accordance with the finite-element method.
Figure 3B:
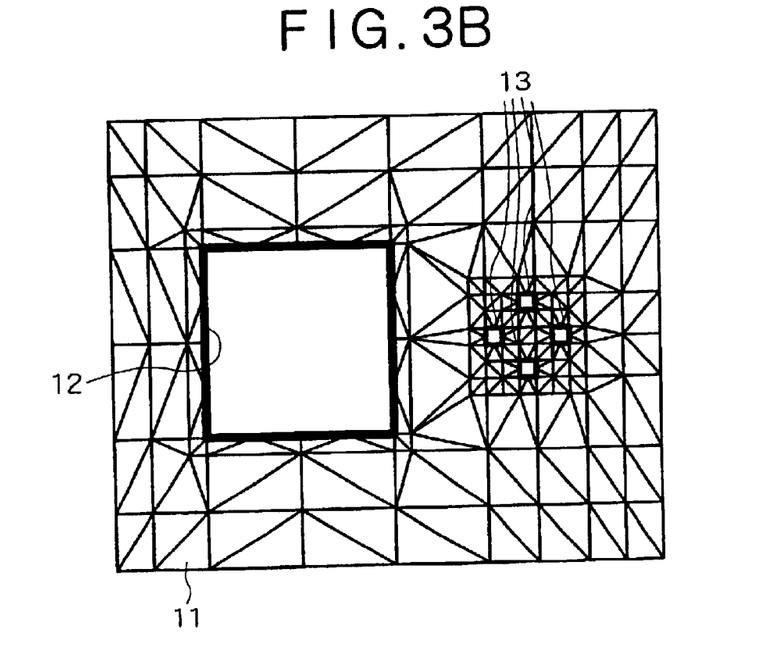

A 0.07 μm generation having approximately 800,000,000 small graphic forms (stencil holes) is assumed, and it is assumed that the number of triangular elements for the finite-element analysis that are influenced directly by small stencil hole patterns around the four rectangular small stencil hole patterns of FIG. 3 is approximately 100. Accordingly, for the 800,000,000 small graphic forms, totally 20,000,000,000 triangles are required.

On the other hand, as an example of the present invention, the entire mask is divided uniformly with regard to only patterns of elements having a size similar to that of a large graphic form whose shape variation cannot be ignored. Since the number of large graphic forms included in a pattern of an LSI is small, the number is substantially equal to that obtained by uniformly dividing the entire mask having no pattern. The size is assumed to be 10 μm. If it is assumed that the size of the region to be analyzed on the mask is a maximum size of an existing lithography tool, then this is 22 mm×22 mm in dimensions on a wafer. If the area of 22 mm×22 mm is divided into squares of 10 μm, then 4,840,000 squares are obtained. If this number is converted into the number of triangles by division, then a doubled number of triangles, that is, approximately 10,000,000 triangles, are obtained.

The finite-element analysis is equivalent to the problem of solving simultaneous linear equations having a number of unknowns which increases in proportion to the number of elements, and the degree of complexity of calculation required for this process is generally represented by O(nlogn). Thus, if the number of elements of 20,000,000,000 is reduced to 1/2000, that is, to 10,000,00, then the processing time can be reduced to y 1/3000.

While a preferred embodiment of the present invention has been described using specific terms, such description is for illustrative purposes only, and it is to be understood that changes and variations may be made without departing from the spirit or scope of the following.

What is claimed is:

1. A method of producing a stencil mask, comprising the steps of:
    calculating displacement amounts of a stencil hole shape arising from an opening of a stencil hole in a stencil mask for each stencil hole patterns using a plane stress analysis;
    correcting the hole pattern based on results of the calculation to obtain a desired pattern shape; and
    forming a desired pattern shape in the stencil mask based on the pattern shape;
    the calculating step calculating the displacement amounts only of those stencil hole patterns which have a size equal to or greater than a predetermined size.

2. A method of producing a stencil mask according to claim 1, wherein, in addition to the calculation of the displacement amounts of only those stencil hole patterns which have a size equal to or greater than the predetermined size, the correcting step performs correction of the position displacement amounts of those of the stencil hole patterns which have a size smaller than the predetermined size.

3. A method of producing a stencil mask according to claim 2, wherein, in addition to the calculation of the displacement amounts of only those stencil hole patterns which have a size equal to or greater than the predetermined size, the calculating step provides, for each of those stencil hole patterns which have a size smaller than the predetermined size, making use of a stress relationship represented by an expression $\{p\}=At[B]^T[D][B]\{d\}$ for the plane stress analysis, $\{p\}$ being a vector of an external force applied to a node, A being the area of an element, t being the thickness of the element, [B] being a displacement-distortion matrix of the element, $[B]^T$ being a transposed matrix of [B], [D] being a stress-distortion matrix of the element, and $\{d\}$ being a displacement amount vector of the node, a variation in volume by the stencil hole pattern to At in the expression for each element of the analysis without providing pattern shape information to perform the calculation of the displacement amounts.

4. A method of producing a stencil mask according to claim 1, wherein each oblique lines and curved lines of a contour of the formed desired pattern shape is modified into a stepwise line of a correction pitch smaller than a pitch of an allowable value.

5. A method of producing a semiconductor device, comprising the step of irradiating a charged particle beam upon a stencil mask on which a desired pattern shape is formed based on a pattern shape obtained by calculating displacement amounts arising from an opening of each of only those stencil hole patterns which have a size equal to or greater than a predetermined size for each of the stencil hole patterns and correcting the hole pattern based on results of the calculation so that the charged particle beam passing through the stencil mask may be irradiated upon a surface of the semiconductor device to form a pattern shape corresponding to the desired pattern of the stencil mask on the surface of the semiconductor device.

6. A method of producing a semiconductor device according to claim 5, wherein the stencil mask used is formed by performing, in addition to the calculation of the displacement amounts of only those stencil hole patterns which have a size equal to or greater than the predetermined size, correction of the position displacement amounts of those stencil hole patterns which have a size smaller than the predetermined size.

7. A method of producing a semiconductor device according to claim 6, wherein the stencil mask used is formed by performing, in addition to the calculation of the displacement amounts of only those stencil hole patterns which have a size equal to or greater than the predetermined size, the calculation of the displacement amounts by providing, for each of those stencil hole patterns which have a size smaller than the predetermined size, making use of a stress relationship represented by an expression $\{p\}=At[B]^T[D][B]\{d\}$ for the plane stress analysis, $\{p\}$ being a vector of an external force applied to a node, A being the area of an element, t being the thickness of the element, [B] being a displacement-distortion matrix of the element, $[B]^T$ being a transposed matrix of [B], [D] being a stress-distortion matrix of the element, and $\{d\}$ being a displacement amount vector of the node, a variation in volume by the stencil hole pattern to At in the expression for each element of the analysis without providing pattern shape information.

8. A method of producing a semiconductor device according to claim 5, wherein the stencil mask wherein each oblique line and curved line of a contour of the formed desired pattern shape is modified to a stepwise line of a correction pitch smaller than a pitch of an allowable value is used.

* * * * *

UNITED STATES PATENT AND TRADEMARK OFFICE
CERTIFICATE OF CORRECTION

PATENT NO. : 6,780,659 B2
DATED : August 24, 2004
INVENTOR(S) : Isao Ashida

It is certified that error appears in the above-identified patent and that said Letters Patent is hereby corrected as shown below:

Title page,
Item [54], Title, should read:
-- METHOD OF PRODUCING STENCIL MASK AND SEMICONDUCTOR DEVICE --

Column 9,
Line 16, "lines and curved lines" should read -- line and curved line --.

Signed and Sealed this

Fifteenth Day of February, 2005

JON W. DUDAS
*Director of the United States Patent and Trademark Office*